(12) United States Patent
Montgomery

(10) Patent No.: US 11,456,443 B2
(45) Date of Patent: Sep. 27, 2022

(54) HIGH ON-AXIS BRIGHTNESS AND LOW COLOUR SHIFT QD-LED PIXEL WITH EQUAL LAYER THICKNESSES BETWEEN COLOUR PIXELS

(71) Applicant: SHARP KABUSHIKI KAISHA, Sakai (JP)

(72) Inventor: David James Montgomery, Bampton (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 16 days.

(21) Appl. No.: 17/109,133

(22) Filed: Dec. 1, 2020

(65) Prior Publication Data
US 2022/0173359 A1    Jun. 2, 2022

(51) Int. Cl.
*H01L 51/52*     (2006.01)
*H01L 27/32*     (2006.01)
*H01L 51/50*     (2006.01)

(52) U.S. Cl.
CPC ...... *H01L 51/5275* (2013.01); *H01L 27/3246* (2013.01); *H01L 51/502* (2013.01); *H01L 51/5056* (2013.01); *H01L 51/5072* (2013.01); *H01L 51/5218* (2013.01); *H01L 51/5234* (2013.01); *H01L 2251/5315* (2013.01)

(58) Field of Classification Search
None
See application file for complete search history.

(56) References Cited

U.S. PATENT DOCUMENTS

| | | |
|---|---|---|
| 7,091,658 B2 | 8/2006 | Ito et al. |
| 7,902,750 B2 | 3/2011 | Takei et al. |
| 8,207,668 B2 | 6/2012 | Cok et al. |
| 8,894,243 B2 | 11/2014 | Cho et al. |

(Continued)

FOREIGN PATENT DOCUMENTS

| | | |
|---|---|---|
| CN | 106876566 A | 6/2017 |
| KR | 1020150020140 A | 2/2015 |
| WO | 2017/205174 A1 | 11/2017 |

OTHER PUBLICATIONS

Lee et al., "Three Dimensional Pixel Configurations for Optical Outcoupling of OLED Displays—Optical Simulation", Proceedings SID Display Week 2019, 2019.

*Primary Examiner* — Daniel Whalen
(74) *Attorney, Agent, or Firm* — ScienBiziP, P.C.

(57) ABSTRACT

A light emitting structure comprises a substrate, a plurality of sub-pixel stacks over the substrate emitting different colors, a bank surrounding the sub-pixel stacks and forming an interior space above the sub-pixel stacks, a first filler material in the interior space, a second filler material over the first filler material, and an interface between the first filler material and the second filler material. Each of the sub-pixel stacks including an emissive layer between a first transport layer and a second transport layer, a first electrode layer coupled to the first transport layer, and a second electrode layer coupled to the second transport layer. The sub-pixel stacks each have a substantially uniform distance between the emissive layer and the first electrode layer. Each of the sub-pixel stacks emits a main emission peak at one direction normal to a top surface of each of the sub-pixel stacks through the interface.

18 Claims, 6 Drawing Sheets

(56) References Cited

U.S. PATENT DOCUMENTS

| | | | |
|---|---|---|---|
| 9,029,843 B2 | 5/2015 | Harada et al. | |
| 9,312,519 B2 | 4/2016 | Yamamoto | |
| 9,583,727 B2 | 2/2017 | Cho et al. | |
| 10,090,489 B2 | 10/2018 | Uchida et al. | |
| 2006/0158098 A1 | 7/2006 | Raychaudhuri et al. | |
| 2015/0084012 A1 | 3/2015 | Kim et al. | |
| 2021/0313485 A1* | 10/2021 | Montgomery | H01L 27/3246 |
| 2021/0399263 A1* | 12/2021 | Montgomery | H01L 51/5072 |

* cited by examiner

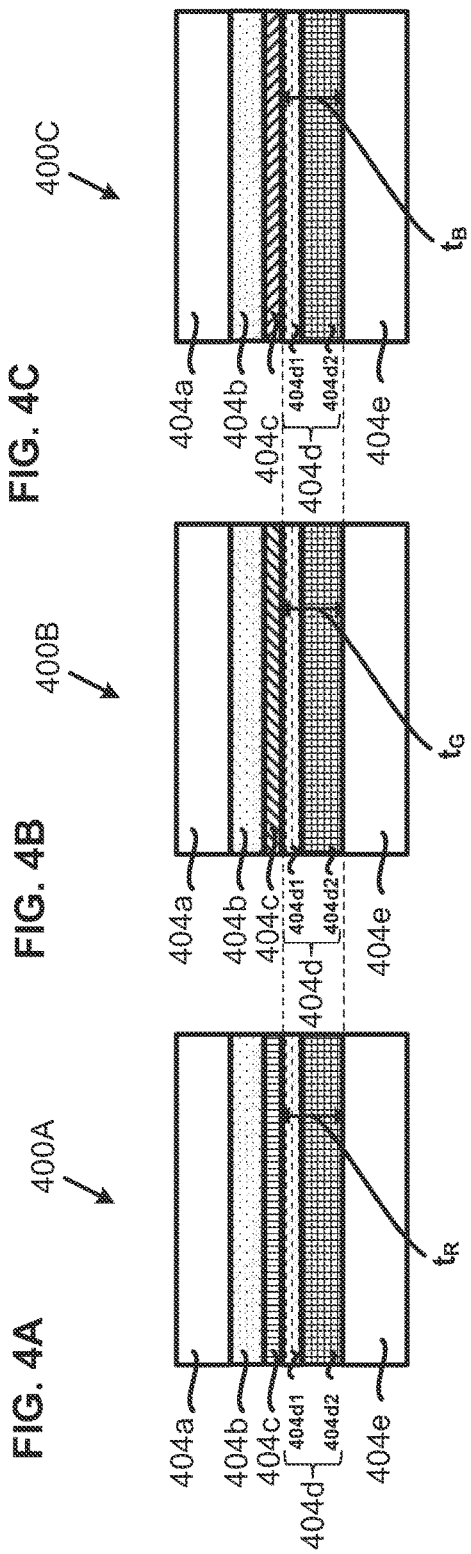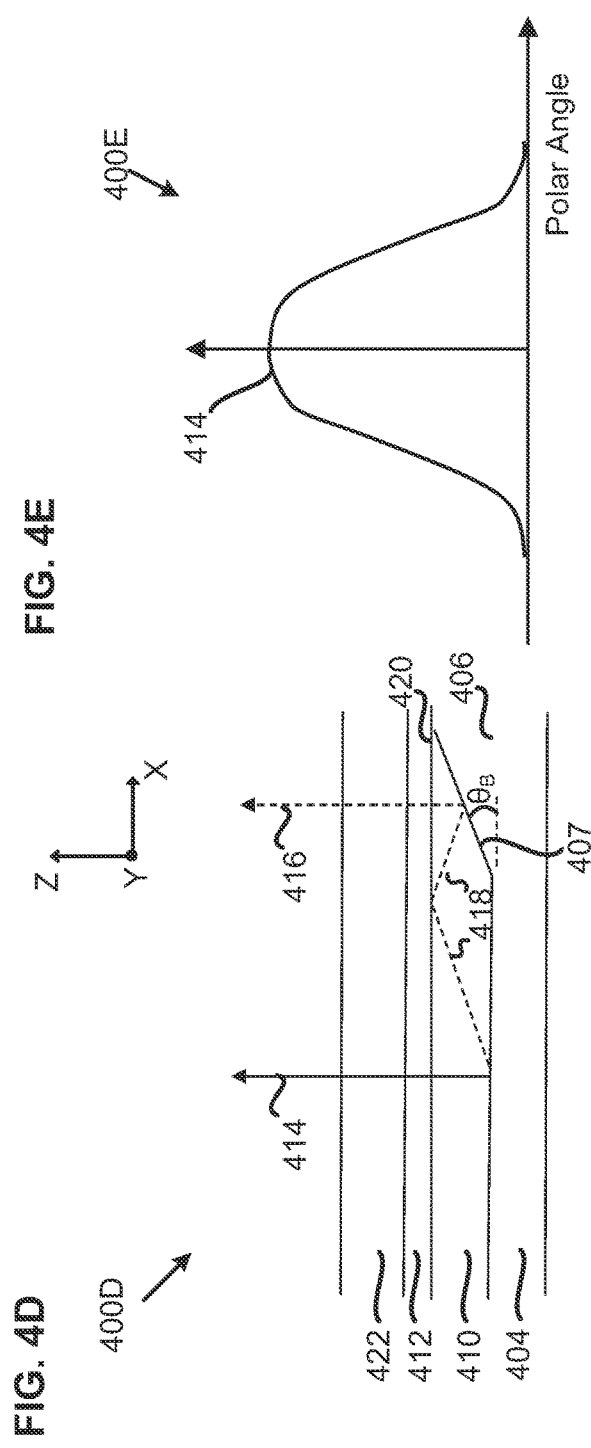

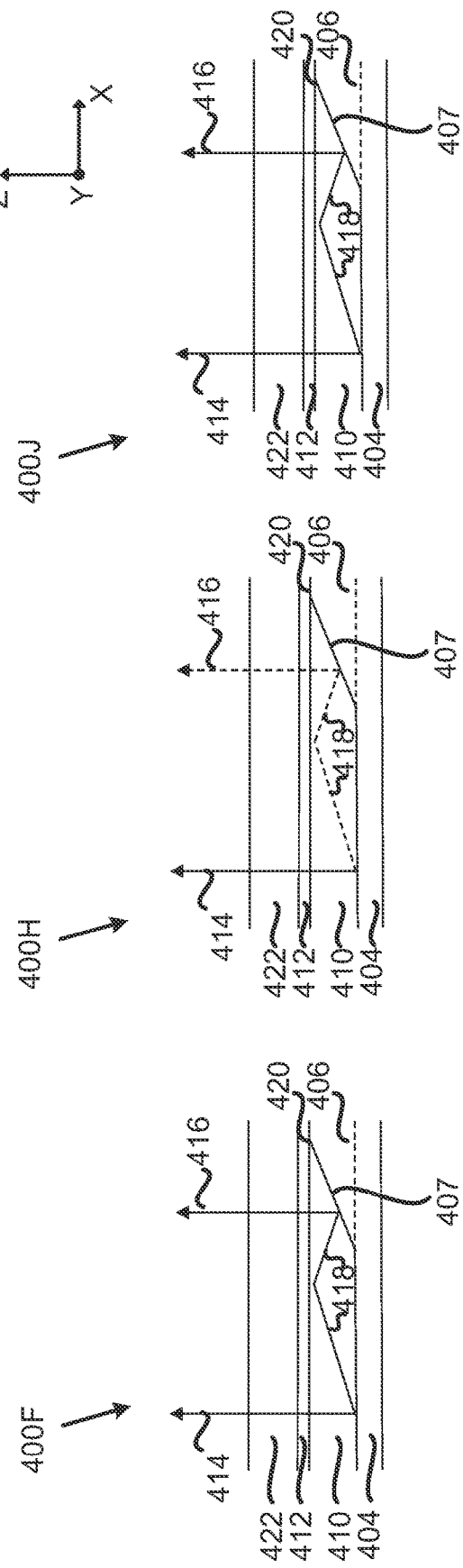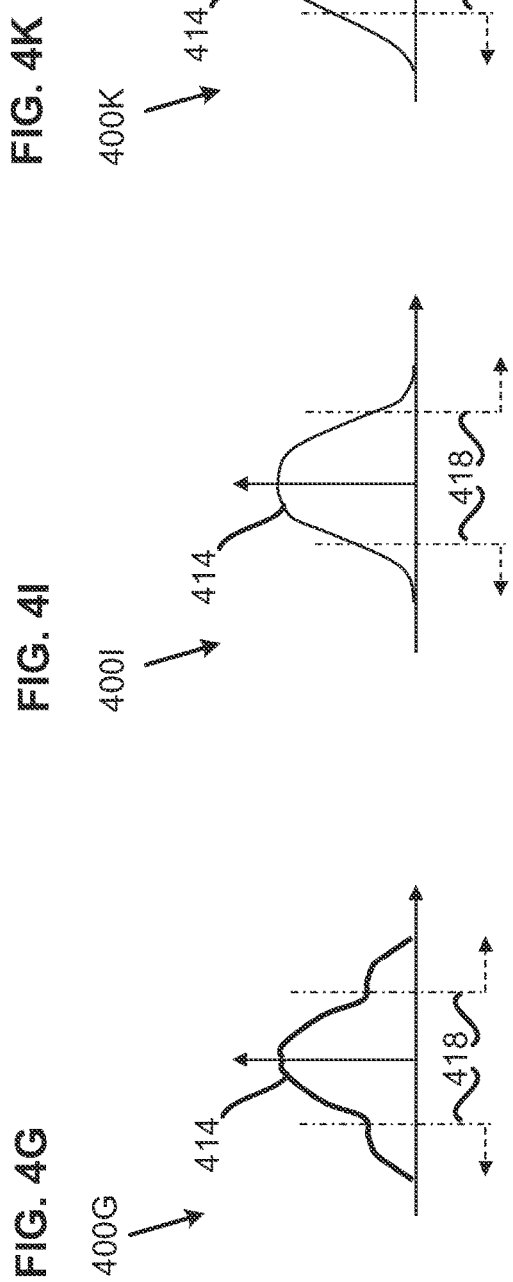

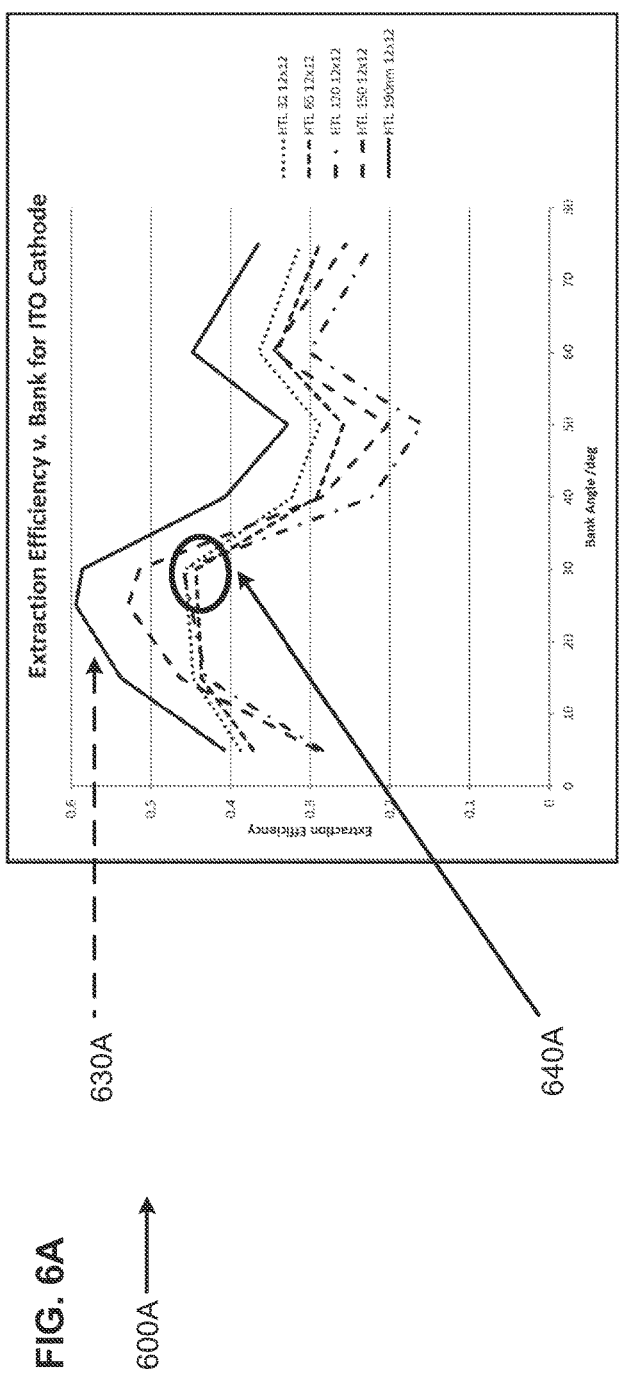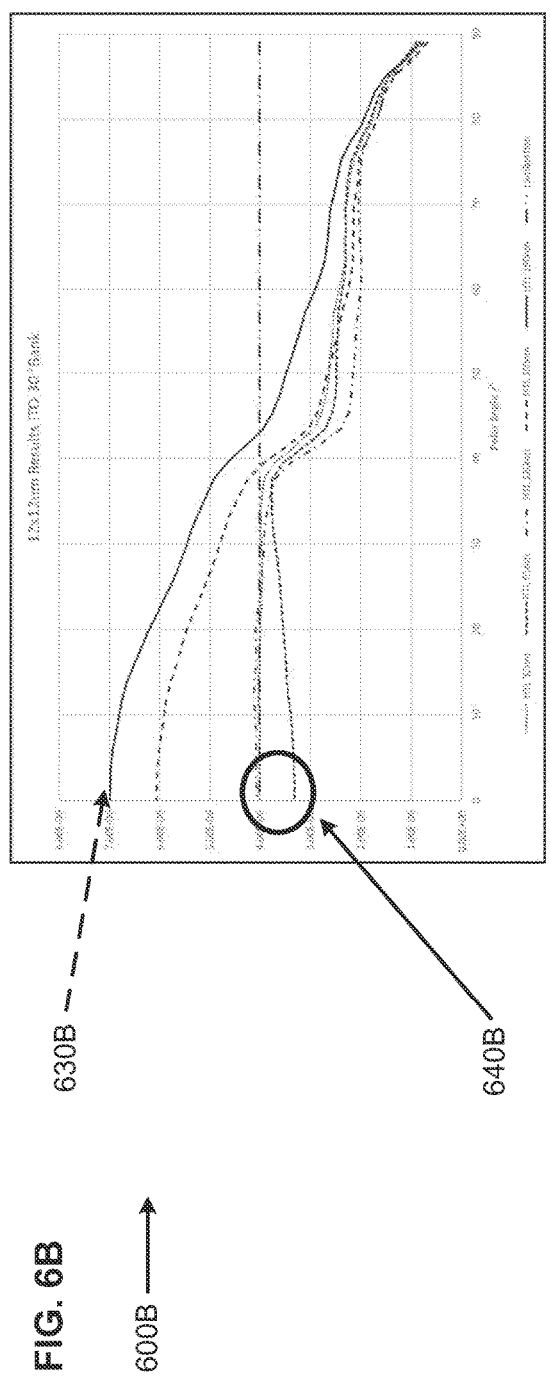
FIG. 6A
FIG. 6B

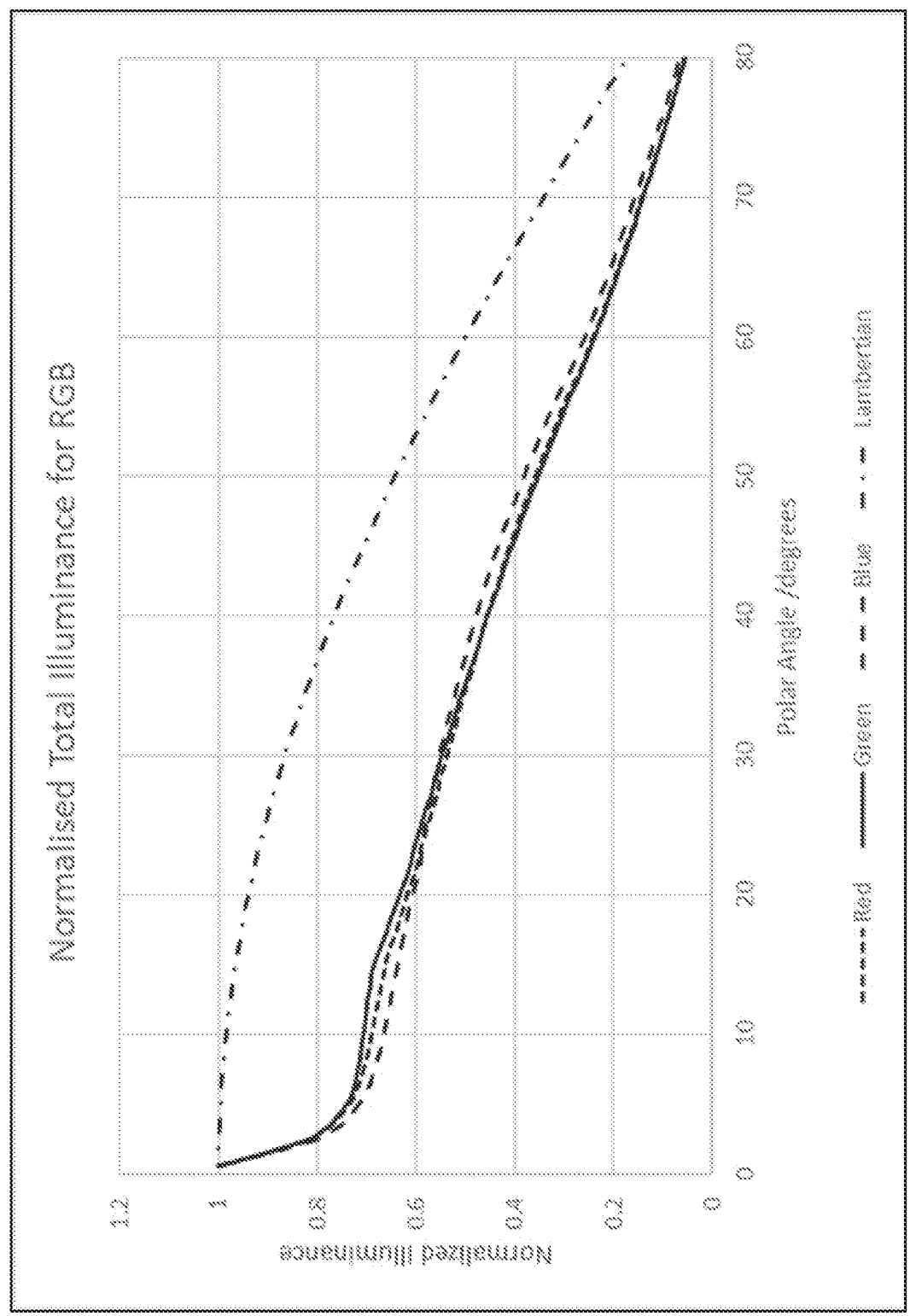
FIG. 7
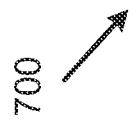

HIGH ON-AXIS BRIGHTNESS AND LOW COLOUR SHIFT QD-LED PIXEL WITH EQUAL LAYER THICKNESSES BETWEEN COLOUR PIXELS

FIELD

The present disclosure generally relates to layers and bank structures used for emissive devices, in particular for. Quantum Dot Light Emitting Diode (LED) displays. In particular, the present disclosure seeks to improve efficiency, reduce color shift, and improve on-axis brightness for top emitting structures embedded in a high refractive index encapsulate material surrounded by a bank while maintaining layer thicknesses for all sub-pixels (e.g. red, green, and blue) constant.

BACKGROUND

An Organic Light Emitting Diode (OLED) is among the most prevalent LEDs used in a display device while quantum dots are proposed as an improvement to OLEDs as they have better spectral emission and are chemically more stable. Quantum dots are often used as phosphors for blue LEDs and exist as backlight for Liquid Crystal Displays (LCDs). Conventional LED displays take a refining approach with cavities in the LED structure and their effect on light. For example, Kodak (US2006/0158098) describes a top emitting structure and Samsung (U.S. Pat. No. 9,583,727) describes an OLED and QLED structure with light emitting regions between reflective areas, one of which is partially transmitting.

Other displays involve methods to improve luminance of cavities in LEDs. For example, Samsung (US2015/0084012) describes the use of dispersive layers in an OLED structure, Samsung (U.S. Pat. No. 8,894,243) describes the use of microstructure scattering to improve efficiency, and 3M (WO2017/205174) describes enhancement of light emission by use of surface plasmon nanoparticles or nanostructures in transport layers.

Methods that involve modifications to a cavity (or cavities) are often difficult to implement as they require very small size features or control of layers. One alternative to modifying the cavity is to use a thick top "filler" layer with a high refractive index, which enables reduction in Fresnel reflections and increases in transmissivity through a top electrode. However, the light in a high index layer may be mostly trapped by total internal reflection (TIR). To extract the trapped light, reflective and/or scattering banks surrounding the filler layer are used to out-couple light that is trapped by TIR.

TCL (CN106876566) and JOLED (U.S. Pat. No. 9,029,843) describe such a pixel arrangement with banks and a filler material above the organic layers of the cavity and between the banks. Hitachi (U.S. Pat. No. 7,091,658) describes banks that can be reflective using electrode metallic material, Cambridge Display Tech (KR1020150020140) describes banks that can be shaped in different structures using different assembly steps, and Sharp (U.S. Pat. No. 10,090,489) describes a shaped reflector underneath the organic layers.

Another approach is to control filler materials. For example, Global OLED (U.S. Pat. No. 8,207,668) describes filler layers that can be controlled, where the fillers and organic layers have different thicknesses for different sub-pixels, in order to maximize the light output as a function of wavelength.

Another approach is to control the organic layers, which can be achieved by appropriate material choices (e.g., lyophilic/lyophobic). For example. Seiko Epson (U.S. Pat. No. 7,902,750) describes the cavity layers being curved but the encapsulation is a planarizing layer and JOLED (U.S. Pat. No. 9,312,519) describes the organic layers both being convex and concave in orthogonal directions.

In yet another approach, Lee et al. ("Three Dimensional Pixel Configurations for Optical Outcoupling of OLED Displays—Optical Simulation", Proceedings SID Display Week 2019) describes simulations of pixel banks structures with the design of an OLED emission layer. Such approach simulates optimum extraction efficiencies with bank structures that maximize efficiency for real bank structures. The optimum solution involves only green light and an ITO electrode, which would not be practical in such a device as the emission spectrum would be too broad, and thus have an inferior color gamut while On-axis brightness (apparent brightness to the user) is not considered.

CITATION LIST

U.S. Pub. No. US 2006/0158098 A1 (Eastman Kodak Company, published Jul. 20, 2006).
U.S. Pat. No. 9,583,727 B2 (Samsung Display Co Ltd, issued Feb. 28, 2017).
U.S. Pub. No. US 2015/0084012 A1 (Samsung Display Co Ltd, published Mar. 26, 2015).
U.S. Pat. No. 8,894,243 B2 (Samsung Corning Precision Materials Co Ltd, issued Nov. 25, 2014).
International Pub. No. WO2017/205174 A1 (3M Innovative Properties Company, published Nov. 30, 2017).
Chinese Pub. No. CN106876566 A (TCL, published Jun. 20, 2017).
U.S. Pat. No. 9,029,843 B2 (JOLED Inc., issued May 12, 2015).
U.S. Pat. No. 7,091,658 B2 (Hitachi, issued Aug. 15, 2006).
KR1020150020140 (Cambridge Display Tech, published Feb. 25, 2015).
U.S. Pat. No. 10,090,489 B2 (Sharp Kabushiki Kaisha, issued Oct. 2, 2018).
U.S. Pat. No. 8,207,668 B2 (Global OLED Technology LLC, issued Jun. 26, 2012).
U.S. Pat. No. 7,902,750 B2 (Seiko Epson Corporation, issued Mar. 8, 2011).
U.S. Pat. No. 9,312,519 B2 (JOLED Inc, issued Apr. 12, 2016).
Lee et al. ("Three Dimensional Pixel Configurations for Optical Outcoupling of OLED Displays—Optical Simulation", Proceedings SID Display Week 2019, published 2019).

SUMMARY

The present disclosure is directed to an emissive display involving a quantum dot electro-emissive material in an LED arrangement.

In a first aspect of the present disclosure, a light emitting structure includes a substrate; a plurality of sub-pixel stacks emitting different colors over a surface of the substrate, each of the plurality of sub-pixel stacks including: an emissive layer between a first transport layer and a second transport layer, a first electrode layer coupled to the first transport layer, and a second electrode layer coupled to the second transport layer; a bank surrounding each of the plurality of sub-pixel stacks and forming an interior space above each of the plurality of sub-pixel stacks; a first filler material in the interior space and having a first refraction index; a second filler material over the first filler material and having a second refractive index lower than the first refractive index; and an interface between the first filler material and the second filler material, where the plurality of sub-pixel stacks has a substantially uniform distance between the emissive layer and the first electrode layer; where at least one of the plurality of sub-pixel stacks emits a main emission peak into the filler materials along an on-axis direction substantially normal to a top surface of the at least one of the plurality of sub-pixel stacks; and where the at least one of the plurality of sub-pixel stacks is configured to an optical mode (N=1) such that a phase shift associated with an emission from the emissive layer of the at least one of the plurality of sub-pixel stacks to the first electrode of the at least one of the plurality of sub-pixel stacks and back to the emissive layer of the at least one of the plurality of sub-pixel stacks is $2\pi$.

In an implementation of the first aspect, at least one of the plurality of sub-pixel stacks is configured to emit light in a plurality of wavelengths having a central wavelength.

In another implementation of the first aspect, emissions in off-axis directions away from the on-axis direction are reflected off the interface via total internal reflection at least once before being reflected off a sloped-surface of the bank and emitted in the on-axis direction through the first filler material.

In yet another implementation of the first aspect, in at least one of the plurality of sub-pixel stacks, a phase shift associated with an emission from the emissive layer to the first electrode layer and back to the emissive layer is either less than $2\pi$ or greater than $2\pi$, resulting in a change in brightness in the main emission peak.

In yet another implementation of the first aspect, emissions in off-axis directions away from the on-axis direction of the at least one of the plurality of sub-pixel stacks are reflected off the interface via total internal reflection at least once before being reflected off a sloped-surface of the bank and emitted in the on-axis direction through the first filler material.

In yet another implementation of the first aspect, the emissions in off-axis directions reflected off the sloped-surface are collimated with the main emission peak, thereby compensating the change in brightness in the main emission peak.

In yet another implementation of the first aspect, the second filler material covers an entire top surface of the first filler material.

In yet another implementation of the first aspect, the second filler material covers a portion of a top surface of the first filler material.

In yet another implementation of the first aspect, sub-pixels associated with the plurality of sub-pixel stacks vary in size to optimize color shift.

In yet another implementation of the first aspect, the emissive layer includes quantum dot emission material, the first transport layer includes a hole transport layer, the second transport layer includes an electron transport layer, the first electrode layer is an anode layer including a metallic reflector for reflecting the light emitted from the emissive layer, and the second electrode layer is a cathode layer including a non-metallic and substantially transparent material.

In yet another implementation of the first aspect, the main emission peak emitted through the interface from the at least one sub-pixel stack has a minimum of light reflected by total internal reflection over all pixels.

In yet another implementation of the first aspect, the main emission peak is emitted through the interface along the on-axis direction in a central region of at least one of the sub-pixel stacks of the light emitting structure.

In yet another implementation of the first aspect, the emissive layer includes quantum dot emission material, the first transport layer includes an electron transport layer, the second transport layer includes a hole transport layer, the first electrode layer is a cathode layer having a metallic reflector for reflecting the light emitted from the emissive layer, and the second electrode layer is an anode layer having a non-metallic and substantially transparent material.

In yet another implementation of the first aspect, the light emitting structure is included in a display device.

In a second aspect of the present disclosure, a sub-pixel structure includes a plurality of sub-pixel stacks emitting different colors, each of the plurality of sub-pixel stacks including an emissive layer between a first transport layer and a second transport layer, a first electrode layer coupled to the first transport layer, and a second electrode layer coupled to the second transport layer, a bank surrounding each of the plurality of sub-pixel stacks and forming an interior space above each of the plurality of sub-pixel stacks, a first filler material in the interior space and having a first refractive index, a second filler material over the first filler material and having a second refractive index lower than the first refractive index, and an interface between the first filler material and the second filler material, where the plurality of sub-pixel stacks has a substantially uniform distance between the emissive layer and the first electrode layer, where at least one of the plurality of sub-pixel stacks is configured to emit light in a plurality of wavelengths having a central wavelength, where the distance between the emissive layer and the first electrode layer is predefined so that at least one of the plurality of sub-pixel stacks emits a main emission peak into the filler materials along an on-axis direction substantially normal to a top surface of the at least one of the plurality of sub-pixel stacks, and where the main emission peak emitted through the interface from the at least one sub-pixel stack has a minimum of light reflected by total internal reflection over all pixels.

In an implementation of the second aspect, in the at least one of the plurality of sub-pixel stacks, a phase shift associated with an emission from the emissive layer to the first electrode and back to the emissive layer is $2\pi$.

In another implementation of the second aspect, in at least another of the plurality of sub-pixel stacks, a phase shift associated with an emission from the emissive layer to the first electrode and back to the emissive layer is either less than $2\pi$ or greater than $2\pi$, resulting in a change in brightness in a main emission peak.

In yet another implementation of the second aspect, emissions in off-axis directions away from the on-axis direction of the at least another of the plurality of sub-pixel stacks are reflected off the interface via total internal reflection at least once before being reflected off a sloped-surface of the bank and emitted in the on-axis direction through the first filler material.

In yet another implementation of the second aspect, the emissions in the off-axis directions reflected off the sloped-surface are collimated with the main emission peak, thereby compensating the change in brightness in the main emission peak.

In yet another implementation of the second aspect, sub-pixels associated with the plurality of sub-pixel stacks vary in size to optimize color shift.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 4A, FIG. 4B, and FIG. 4C are detailed schematic cross-sectional views of three example three sub-pixel stacks of another example light emitting structure in accordance with an example implementation of the present disclosure.

FIG. 4D illustrates a portion of an example light emitting structure in accordance with an example implementation of the present disclosure.

FIG. 4E illustrates an example angular distribution diagram of a main emission peak as measured in the example light emitting structure of FIG. 4D.

FIG. 4F, FIG. 4H, and FIG. 4J are schematic cross-sectional views of three example light emitting structures in accordance with an example implementation of the present disclosure.

FIG. 4G, FIG. 4I, and FIG. 4K are example angular distribution diagrams of the three example light emitting structures in FIG. 4F, FIG. 4H, and FIG. 4J, respectively.

FIG. 6A is schematic diagram illustrating extraction efficiency of example light emitting structures having various distances in accordance with an example implementation of the present disclosure.

FIG. 6B is schematic diagram illustrating peak brightnesses of the example light emitting structures having the various distances in FIG. 6A.

FIG. 7 is schematic diagram illustrating angular distributions of the example light emitting structure in FIG. 5 with respect to a Lambertian emission.

DESCRIPTION

Figure 1:
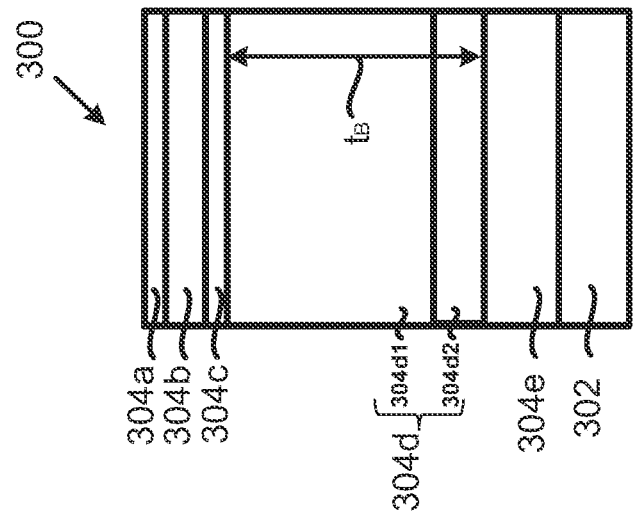
FIG. 1 is a schematic cross-sectional view of a related art sub-pixel stack in alight emitting structure.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series and the equivalent. The expression "at least one of A, and C" or "at least one of the following: A, B and C" means "only A, or only B, or only C, or any combination of A. B and C."

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

The present disclosure relates to an emissive display involving a quantum dot electro-emissive material in a light emitting diode (LED) arrangement. The LED arrangement typically includes a layer of quantum dot (QD) emission material (e.g., emissive layer) sandwiched between an electron transport layer (ETL) and a hole transport layer (HTL). The three layers are sandwiched between two conductive layers to form a sub-pixel stack. In one or more implementations of the present disclosure, a "top" emitting (TE) structure is used. The TE structure involves light emission from a side of the TE structure opposite a glass substrate on which the TE structure is disposed.

In one or more implementations of the present disclosure, fabrication of a TE device involves one thick layer of conductive reflective material, typically, made of a metal (e.g., silver or aluminium) deposited on the glass substrate with the HTL on the conductive reflective layer (e.g., a reflective conductor or reflective electrode), the emissive layer on the HTL, the ETL on the emissive layer, and a transparent electrode layer on the ETL. In one preferred implementation, the reflective electrode has a thickness greater than 80 nm (i.e., 1 nm=10^-9 meters). In another preferred implementation, the reflective electrode includes a layer of silver having a thickness of approximately 100 nm and a layer of Indium Tin Oxide (ITO) having a thickness of approximately 10 nm. In one preferred implementation, the HTL is made of a layer of PEDOT:PSS (poly(3,4-ethylene-dioxythiophene) polystyrene sulfonate) approximately 40 nm thick and a layer of TFB (poly(9,9'-dioctylfluorene-co-bis-N,N'-(4-butylphenyl)diphenylamine)) having a thickness of approximately 20 nm on the PEDOT:PSS layer. In other implementations, other HTL materials may also be applicable to the present disclosure, and are not limited to the examples provided herein. In another preferred implementation, an approximately 20 nm thick emissive layer is disposed on the HTL and the ETL is disposed on the emissive layer. In another preferred implementation, the ETL layer is made of Zinc Oxide (ZnO) nanoparticles and has a thickness of approximately 30-80 nm. In one preferred implementation, the transparent electrode layer is a thin metal layer thick enough to carry sufficient current yet thin enough to be transparent to light and disposed on the ETL layer. In one preferred implementation, the transparent electrode layer is an ITO layer having a thickness of approximately 80 nm. It should be noted that the thicknesses of the layers described above may vary depending on the preferred optical configurations, thus are not limited to the example provided herein.

In one or more implementations of the present disclosure, angular emission distributions from the emissive layer can be determined by a thickness (or distance) between the emissive layer and the reflective electrode layer (e.g., at the bottom of the sub-pixel stack). The distance is directly dependent on the individual thickness of the HTL and refractive index of each layer in the HTL.

In one implementation, where the reflective electrode is a perfect mirror, the reflective electrode layer is at a distance of half a wavelength (e.g., $\lambda/2$) apart from the emissive layer. The distance may be 0.5, 1, or any integer with a multiple of 0.5 wavelength apart from the emissive layer. In an example implementation where the reflective electrode is not a perfect mirror (e.g., in other words a phase shift occurs), a point of reflection will not be located exactly at the surface of the reflective electrode. In one implementation, the reflective electrode is, for example, at a distance of about half a wavelength apart from the emissive layer in order generate a main emission peak. However, in order to offset the effects of the phase shift in the reflective electrode, the distance is adjusted to about 0.2 wavelength for most common materials. The term "emission" described in the present disclosure may refer to a distribution of wavelengths emitted, but is not limited to a single wavelength. The term "wavelength" in the present disclosure may be used to describe a peak or central wavelength amongst the plurality of wavelengths, but is not limited to the description provided herein.

The present disclosure is not limited to the provided examples as the essential principle of the disclosed structure still applies if the arrangement of the ETL and HTL are reversed. In one preferred implementation of the present disclosure the transport, layer is thinner than the transport layer disposed closer to the glass substrate regardless of whether the ETL or the HTL is disposed on the emitting side of the emissive layer away from the glass substrate.

The example implementations of the present disclosure may be related to QLED structures. However, the present disclosure is not limited only to QLED structures and may be applicable to various implementations related to OLED structures.

In QLED sub-pixels, an interior space structure (e.g., a cavity structure) may be outlined by a sub-pixel stack and a bank structure surrounding the sub-pixel stack. A filler material with higher refractive index may be disposed in the interior space structure above the sub-pixel stack. The bank structure may have a height that is, at least, the same as or higher than the filler material with high refractive index. The bank structure may also be lower in height with respect to the filler material in some implementations. The filler material with higher refractive index may extract more light from the emissive layers than directly into air, as the refractive index of the filler material is more closely matched to the emissive layers and a much lower Fresnel reflection loss. A low refractive index layer is disposed over the filler material. An upper layer disposed above the low refractive index layer may include encapsulating glass or other materials. The low refractive index layer traps off-axis light in the filler material by total internal reflection. In one or more implementations, the low refractive index layer may be at least one of an air gap, siloxane based nano-composite polymers from Inkron with refractive index as low as 1.15, Poly(1,1,1,3,3,3-hexafluoroisopropyl acrylate) with a refractive index of 1.375, and Poly(2,2,3,3,4,4,4-heptafluorobutyl acrylate) with a refractive index of 1.377.

In the present disclosure with the interior space structure and the top transparent electrode, a thickness (or distance) between the emissive layer and the reflective electrode may be tuned in one color sub-pixel stack such that a main emission peak may emit directly from the emissive layer in an on-axis direction substantially normal to a top surface of the sub-pixel stack, with a minimum of total internal reflection. Light may also emit in off-axis directions away from the on-axis direction. The off-axis emissions may be reflected by the top surface (e.g., an interface) of the filler material via total internal reflection (TIR) at least once and thus propagated in the filler material, reflecting from the emissive layers and the TIR surface, before being reflected off a sloped-surface of the bank and reflected towards the on-axis direction such that the totally internally reflected emissions may be collimated with the on-axis emission. The bank structure at ends of each pixel may be designed such that a sloped angle of the bank structure (e.g., bank angle) is one-half an angle of the mean angle of the off-axis portion(s) of the emission into the filler material subject to total internal reflection. In one or more implementations, the bank angle is between 0-80 degrees. In one preferred implementation, the bank angle is about 20-30 degrees. In yet another preferred implementation, the bank angle is approximately 30 degrees.

Figure 2:
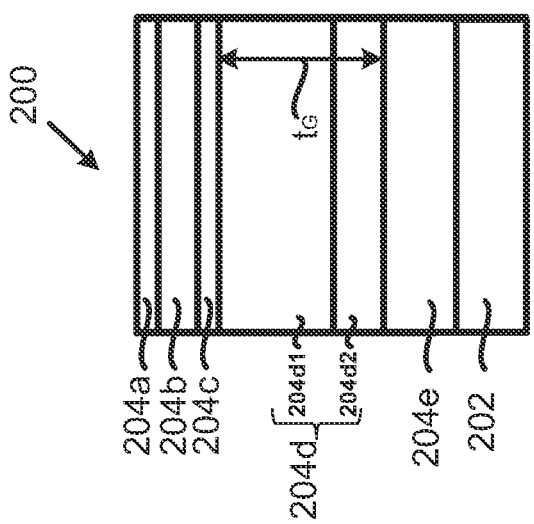
FIG. 2 is a schematic cross-sectional view of another related art sub-pixel stack in the light emitting structure.
Figure 3:
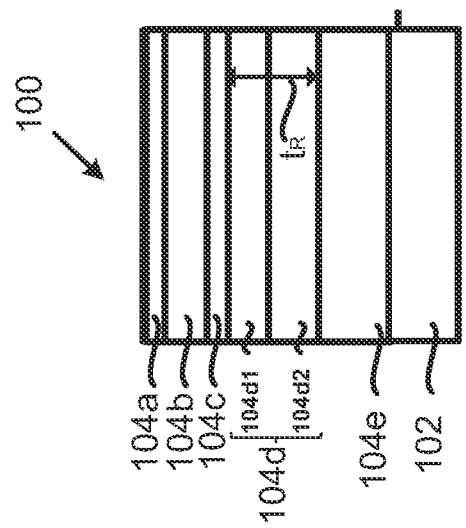
FIG. 3 is a schematic cross-sectional view of yet another related art sub-pixel stack in the light emitting structure.

The effective angular distribution is determined by the interference between each individual dipole source in the emitting layer and its reflection in the bottom reflector. Since the thickness (or distance) between the bottom reflector and the emitting layer primarily determines such separation and interference depends critically on wavelength of the source light emission (e.g., sub-pixel stacks), the design of each color sub-pixel stack (e.g., red, green, and blue, etc.) is different. As illustrated in FIGS. 1-3, the HTLs in different color sub-pixel stacks have different thicknesses to ensure that the distance (thickness) between the emissive layer and the reflective electrode is tuned for each particular colored sub-pixel stack to achieve optimal on-axis brightness and efficiency. The differences in thickness in the HTLs require separate patterning steps for different colored sub-pixel stacks during fabrication, which may result in additional and costly masking procedures. In the sub-pixel structure where different thicknesses for different colored sub-pixel stacks of the HTL is applied, although costly, optimum peak on-axis brightness and efficiency can be achieved using the example structures of sub-pixel stacks as illustrated in FIGS. 1-3. Moreover, in the sub-pixel structure where different thicknesses for different colored sub-pixel stacks of the HTL is applied, thin layers in the sub-pixel structure may lead to a lower absorption than thick layers, if the materials in the HTLs are absorbing.

In one or more implementations of the present application, if all HTLs of different color sub-pixel stacks were fabricated of substantially equal thicknesses (e.g., a substantially uniform thickness (or distance) between an emissive layer and a bottom reflector across all of the sub-pixel stacks of different colors), the fabrication method for the display can be simplified and lead to significant reduction in cost. An optimized HTL thickness is dependent on wavelength of the light, emission. If a light emitting structure has a transparent electrode on each of red, green, and blue color emitting sub-pixel stacks, and the red, green, and blue color emitting sub-pixel stacks each include a very thin HTL having a substantially equal thickness (uniform distance), the light emitting structure with the thin and HTLs having substantially equal thicknesses (e.g., uniform distance) may produce a relatively similar emission profile as the light emitting structure with HTLs having different thicknesses (non-uniform distance) when used with the bank and high index filler and low index layers described here. Such similar emission profiles are achievable because the phase shift of HTL propagation and reflection phase shift back to the emissive layer is close to 2π (e.g., one wavelength of a central light emission color (e.g., green)), then the light emission pattern into the filler material is broad and has its peak on-axis. Moreover, the HTL thickness is nominally half a wavelength. however, since the bottom reflector is a real material (e.g., reflective metal), there is a phase shift associated with the real properties of the metal layer and are dependent on the metal used for the bottom reflector. Thus, the phase shift associated with light emissions from the emissive layer to the bottom reflector and back to the emissive layer is substantially 2π in order to achieve a substantially uniform thickness (or distance). The light emitting structure with uniform distance (or thickness) may provide reduced brightness and efficiency as compared to the configuration with different distances (e.g., thicknesses). However, the resulting angular distributions from the sub-pixel stack structures having a substantially uniform distance, when used with an appropriate pixel filler arrangement as discussed above, are relatively insensitive to the distance between the bottom reflector and emitting layer. Thus, in light emitting structures that apply HTLs of substantially the same thickness (e.g., a uniform distance) in the sub-pixel stacks emitting different wavelengths (e.g., red, green, blue color emissions), the red and blue emissions (e.g., if the centre light emission is green) may still have similar angular distributions as the green emissions, thus still providing a low color shift while reducing cost.

Specifically, a low color shift may be achieved because while a majority of light leaves the filler material directly (e.g., the main emission peak that emitted in an on-axis direction), a small but significant amount of light is propagated by total internal reflection (TIR) in the filler material to the banks and is then collimated (e.g., light emitted in off-axis directions) by the banks. The effect of changing the wavelength is a lowered brightness of the central emission. However, the effect of reduction in brightness of the central emission is compensated by an increase in the off-axis light emission captured by TIR and propagated to the banks. As both of these light propagations ultimately collimate the light, these two factors compensate each other and there is little change in the resulting angular distribution for various wavelengths (e.g. red, green, blue color). Thus, a light emitting structure with substantially the same layer thicknesses (e.g., substantially the same HTL thickness for all color sub-pixel stacks) and low off-axis color shift can be obtained. The light emitting structure with similar thicknesses (e.g., a substantially uniform distance) may provide reduced brightness and efficiency as compared to the configuration with different thicknesses (e.g., different distances), however, the angular spread of light is wider and the fabrication is simpler, which can be applicable to large displays (e.g., TB style displays).

According to the present disclosure, on-axis brightness is maximized as well as the brightness perceived by the user even if total light output efficiency is not maximized. Since light of the on-axis emission is generally perceived by a user at a central area of a pixel and light of the off axis emission is generally perceived at edges of a bank, a distribution of light from these different spectral areas may provide a more balanced color distribution at all angles, thereby minimising color shift at various angles. Obtaining similar angular distributions for each of the red, green and blue pixels is necessary in order to prevent a change in perceived color with viewing angle and is an inherent problem with this type of thin layer emissive displays (e.g. OLED). The use of a transparent electrode and pixel banks may improve color shift performance. The high tolerance of angular distribution to wavelength in this type of thin layer and pixel bank structure may need further tuning to further improve the color shift performance without adding extra mask steps. One such method is having different sized pixels for red, green and blue. A pixel size of a sub-pixel stack is a distance between the bank surrounding the sub-pixel stack. For example, a larger pixel may require more bounces of the TIR light to reach the bank, thus more light is absorbed from such light (but not the on-axis non-TIR light) so that the balance is altered. In this case the balance between on-axis and off-axis light can be changed to as to better match the angular distributions. In general, in most cases, the pixels may have different sizes to obtain best results, but may not be necessary for the essential disclosure of the present application. In the present disclosure, the sub-pixels vary in pixel sizes such that color shift for each of the sub-pixel stacks is optimized.

An alternative would be in having different QD EML layer thicknesses. This layer would need to be masked as different emitting QD are needed for each, so a mask step is necessary in any case. Only this layer can be changed but there are practical limitations on how much difference can be achieved.

An example light emitting structure in the present implementation may include a substrate, a sub-pixel stack, a bank, a first filler material, a second filler material, and a glass cover as described above, thus details of the elements of the light emitting structure are omitted for brevity. In one or more implementations of the present disclosure, the first filler material may be a higher refractive index material, and the second filler material may be a lower refractive index material relative to the first filler material. The sub-pixel stack may be disposed on the substrate with the bank surrounding the sub-pixel stack to form an interior space above the sub-pixel stack.

In one implementation of the present disclosure, the first filler material may be disposed in the interior space that is formed by the bank surrounding the sub-pixel stack. The second filler material may be disposed continuously over the first filler material and the bank.

In another implementation, the second filler material may be partially disposed on the first filler material. In one or more implementations, the bank may be greater in thickness than the thickness of the first filler material. In one or more implementations, the bank is in contact with the substrate. In a preferred implementation, the bank may be in contact or almost in contact with the second filler material. In one or more implementations, the glass cover may be disposed continuously over the second filler material.

In one or more implementations, light is emitted from the sub-pixel stack through the first filler material, the second filler material, and the glass cover. The first filler material may have a higher refractive index than air so that the first filler material may extract light from the sub-pixel stack to a greater extent than air as a filler material. Light trapped in the sub-pixel stack may be quickly absorbed while light trapped in the first filler material may propagate to edges of the bank and be extracted by reflection.

In one or more implementations, the first filler material may have a higher refractive index than those of the sub-pixel stack and the second filler material. In one implementation, the second filler material (e.g., a lower refractive index layer) may be an air gap. In one or more implementations, the bank may be opaque. A surface of the bank facing the first filler material may be scattering reflective or specular reflective, and may be at an angle (e.g., sloped) with respect to the plane of the substrate (e.g. a glass substrate).

In the present disclosure, the emissive layer in a sub-pixel stack may emit light in a range of wavelengths having a central wavelength that is typically taken as the main emission peak. The central wavelength is the wavelength of the highest spectral brightness in the emission spectrum from the light emission source. In the present disclosure, for wavelengths emitted by the emissive layer that are longer on average than the central wavelength, a stronger intensity off-axis emission than the on-axis emission may be produced. The on-axis emission is stronger in intensity than the off-axis emission for wavelengths shorter than the central wavelength.

FIG. 1 is a schematic cross-sectional view of a related art sub-pixel stack in a light emitting structure. FIG. 2 is a schematic cross-sectional view of another related art sub-pixel stack in the example light emitting structure. FIG. 3 is a schematic cross-sectional view of yet another related art sub-pixel stack in the example light emitting structure. With reference to FIGS. 1-3, the example sub-pixel stack structures 100, 200, and 300 may be sub-pixel stack structures emitting light with different wavelengths (e.g., colors of red, green, blue).

In one or more implementations of the present disclosure, each of the example sub-pixel stacks 100, 200, and 300 in FIGS. 1, 2, and 3, respectively, may include a first electrode layer (104a, 204a, 304a), an ETL (104b, 204b, 304b), an emissive layer (104c, 204c, 304c), an HTL (104d, 204d, 304d), and a second electrode layer (104e, 204e, 304e). Each of the HTLs (104d, 204d, 304d) may include a TFB layer (104d1, 204d1, 304d1) and a PEDOT:PSS layer (104d2, 204d2, 304d2), respectively.

As shown in FIG. 1, the HTL 104d may include a TFB layer 104d1 and a PEDOT:PSS layer 104d2. In another implementation, the HTL 104d may include other layers and is not limited to the example layers provided herein. In another implementation, the previous arrangements of the HTL 104d and the ETL 104b may be reversed depending on the arrangements of the first electrode layer 104a and second electrode layer 104e.

In one or more implementations of the present disclosure, the first electrode layer 104a may be a transparent top electrode and the second electrode layer 104e may be a bottom reflective electrode. The first electrode layer 104a may be a cathode layer that is non-metallic, substantially transparent, and disposed on the ETL layer 104b. The second electrode layer 104e may be disposed on a substrate 102 and may be an anode layer that is a metallic reflector reflecting light emitted from the emissive layer 104c.

However, the arrangement of the first electrode layer 104a and the second electrode layer 104e is not limited to the examples provided herein and may be reversed. For example, the first electrode layer 104a may be a bottom anode layer that is a metallic reflector reflecting light emitted from the emissive layer 104c and the second electrode layer 104e may be a top cathode layer that is non-metallic and substantially transparent.

In one implementation with reference to FIGS. 1-3, the HTLs 104d, 204d, and 304d have different distances (e.g., HTL thicknesses $t_R$, $t_G$, $t_B$) for the three sub-pixel stacks 100, 200, and 300 emitting different colors (e.g., red, green, blue of different wavelengths), which may lead to optimal brightness and low-color shift. However, fabricating sub-pixel stacks 100, 200 and 300 in a display can be complex and costly because multiple masking and patterning steps are required to form the HTLs 104d, 204d, and 304d having different thicknesses. Specifically, in the light emitting structure of the present application with the arrangement of different distances (e.g., different HTL thicknesses, for example 104d, 204d, 304d) for different sub-pixel stacks, high efficiency and on-axis brightness may be achieved. However, as shown in FIGS. 1-3, such arrangement illustrates a different thickness for each color (e.g., red, green, blue) sub-pixel stack to obtain the same emission profile for each of the sub-pixel stacks and to match the angular distribution for the colors, thus reducing the over color shift of the light emitting structure. Because fabrication of HTLs in the sub-pixel stacks of different colors, for example, patterning and masking procedures in the layering of the HTLs in the sub-pixel stacks, are complex and expensive, especially for panels with large display areas, additional layer thickening procedures are required to correctly achieve the same optical profile for all sub-pixels stacks emitting different colors. In one implementation, the example green color sub-pixel stack 200 in FIG. 2 is set as the sub-pixel stack that may be the closest to a phase difference associated with an emission from the emissive layer to the first electrode and back to the emissive layer of a 4π phase shift, or an optical mode of N=2, where a thickness between the first electrode and back to the emissive layer is approximately one wavelength.

FIG. 4A, FIG. 4B, and FIG. 4C are detailed schematic cross-sectional views of three example three sub-pixel stacks 400A, 400B, 400C of another example light emitting structure in accordance with an example implementation of the present disclosure.

In one or more implementations of the present disclosure, the three example three sub-pixel stacks 400A, 400B, 400C may be sub-pixel stack structures emitting light emissions with different wavelengths (e.g., colors of red, green, blue) which are included in, for example, a sub-pixel stack layer 404 of an example light emitting structure 400D in FIG. 4D. The example light emitting structure in the present implementation may include a substrate, a sub-pixel stack, a bank, a first filler material, a second filler material, and a glass cover as described above and may be similar to that as described with reference to FIGS. 1-3, thus details of the light emitting structures are omitted for brevity.

The three example three sub-pixel stacks 400A, 400B, 400C in FIGS. 4A-4C differ from the three example three sub-pixel stacks 100, 200, 300 in FIGS. 1-3 in that the HTLs in the three example three sub-pixel stacks 400A, 400B, 400C have a substantially uniform distance (e.g., the same HTL thicknesses $t_R$, $t_G$, $t_B$ in FIGS. 4A, 4B, 4C) as opposed to the HTLs in the three example three sub-pixel stacks 100, 200, 300 that have different distances (e.g., different HTL thicknesses $t_R$, $t_G$, $t_B$ in FIGS. 1, 2, 3). The example light emitting structure having the three example three sub-pixel stacks 400A, 400B, 400C in FIGS. 4A, 4B, 4C with a substantially uniform thickness may still provide low color shift while providing significantly lower the fabrication cost as opposed to the example light emitting structure having the three example sub-pixel stacks 100, 200, 300 in FIGS. 1-3 with different distances. Substantially the same thickness refers to the process of fabricating the layer being the same for each pixel, or all done at the same time in the same way. There may be some fabrication variation but this is understood.

In one or more implementations, the example sub-pixel stacks 400A-400C in FIGS. 4A-4C each including a first electrode layer 404a, an ETL 404b, an emissive layer 404c, an HTL 404d including a TFB layer 404d1 and a PEDOT:PSS layer 404d2, and a second electrode layer 404e. In one implementation, the first electrode layer 404*a* may be a transparent electrode, and the second electrode layer 404*e* may be a reflective electrode. However, the arrangement of the first electrode layer 404*a* and the second electrode layer 404*e* may be reversed depending on the direction in which light emissions are directed, for example, the first electrode layer 404*a* may be a reflective electrode, and the second electrode layer 404*e* may be a transparent electrode. The arrangement of the first electrode layer 404*a* and the second electrode layer 404*e* may be different and are not limited to the example provided herein. In one or more implementations, the three example structures 400A-400C are sub-pixel stacks for three color pixels (e.g., red, green, and blue pixels respectively). It should be understood that implementations of the present disclosure are not limited to three colors, as four or more colors can be used. For example, four sub-pixel stacks for four separate color pixels (e.g., red, green, yellow, blue, etc.) can be implemented. The thickness (or distance) between the emissive layer 404*e* and the reflective electrode 404*e* or a thickness (e.g., $t_R$, $t_G$, $t_B$ in FIGS. 4A, 4B, 4C) of the HTL 404*d*, may be tuned such that only constructive on-axis main emission peaks are emitted. In one or more implementations, the HTLs 404*d* of the three example sub-pixel stacks 400A-400C in FIGS. 4A-4C differ from the HTLs 104*d*, 204*d*, 304*d* of the three example sub-pixel stacks 100-300 in FIGS. 1-3 in that all HTLs 404*d* of the three example sub-pixel stacks 400A-400C have substantially the same thicknesses (e.g., $t_R$, $t_G$, $t_B$). In other words, the three example sub-pixel stacks 400A-400C have substantially an uniform distance between the corresponding emissive layers 404*c* and the second electrode layers 404*e*. In one or more implementations, a preferred phase shift associated with light emissions from the emissive layer 404*c* (e.g. first electrode layer) to the bottom reflector 404*e* (second electrode layer 404*e*) and back to the emission layer 404*c* may be $2\pi$ for one of the HTL 404*d* of the three example sub-pixel stacks 400A-400C in FIGS. 4A-4C. In one or more implementations, the example green color sub-pixel stack 400B in FIG. 4B is set as the sub-pixel stack that may be the closest to a phase shift associated with an emission from the emissive layer to the first electrode and back to the emissive layer of $2\pi$, or an optical mode of N=1 The optical mode number, N, is the number of complete $2\pi$ phases from the emissive layer to the first electrode and back to the emissive layer. The red color sub-pixel stack (e.g., 400A in FIG. 4A) and the blue color sub-pixel stack (e.g., 400C in FIG. 4C) may be de-tuned, in that the HTL thickness (e.g., $t_R$ for red and $t_B$ for blue) may no longer match the phase requirement (e.g., phase shift of $2\pi$) of the corresponding central light emission color. For example, the red color sub-pixel stack (e.g., 400A in FIG. 4A) and the blue color sub-pixel stack (e.g., 400C in FIG. 4C) may have a phase shift greater than or less than $2\pi$.

In one or more preferred implementations, the red color sub-pixel stack (e.g., 400B in FIG. 4B) is set as the sub-pixel stack that is closest to a phase shift associated with an emission from the emissive layer to the first electrode and back to the emissive layer is $2\pi$, or an optical mode of N=1. The green color sub-pixel stack (e.g., 400A in FIG. 4A) and the blue color sub-pixel stack (e.g., 400C in FIG. 4C) may be "de-tuned", in that the HTL thickness (e.g., $t_G$ for green and $t_B$ for blue) may no longer match the phase requirement (e.g., phase shift of $2\pi$) of the corresponding central light emission color. For example, the green color sub-pixel stack (e.g., 400A in FIG. 4A) and the blue color sub-pixel stack (e.g., 400C in FIG. 4C) may have a phase shift greater than or less than $2\pi$. In one or more implementations, the green color sub-pixel stack or the red color sub-pixel stack (e.g., as 400B in FIG. 4B) setting as the sub-pixel stack that is closest to a phase shift associated with an emission from the emissive layer to the first electrode and back to the emissive layer is $2\pi$ provides the more preferred optical mode.

FIG. 4D illustrates a portion of an example light emitting structure in accordance with an example implementation of the present disclosure. FIG. 4E illustrates an example angular distribution diagram of a main emission peak as measured in the example light emitting structure of FIG. 4D. FIG. 4F, FIG. 4H, and FIG. 4J are schematic cross-sectional views of three example light emitting structures in accordance with an example implementation of the present disclosure. FIG. 4G, FIG. 4I, and FIG. 4K are example angular distribution diagrams of the three example light emitting structures in FIG. 4F, FIG. 4H, and FIG. 4J, respectively.

The example structure 400A in FIG. 4A, the example structure 400B in FIG. 4B, and the example structure 400C in FIG. 4C may each be included in an example light emitting structure 400D in FIG. 4D. The example light emitting structure 400D may include a sub-pixel stack 404, a bank 406 with a sloped sidewall 407, a first filler material 410, a second filler material 412 with a refractive index lower than the first filler material 410, an interface 420 between the first filler material 410 and the second filler material 412, and a glass cover 422.

In one or more implementations of the present application, a light emitting structure including different colored sub-pixel stacks (e.g., sub-pixel stacks 400A-400C in FIGS. 4A-4C) having a uniform distance (e.g., substantially same thicknesses for all HTLs 404*d*) may have a much thinner optical arrangement compared to a light emitting structure with different color sub-pixel stacks (e.g., sub-pixel stacks 100-300 in FIGS. 1-3) having different thicknesses. In one implementation, an example light emitting structure with color sub-pixel stacks 400A, 400B, and 400C may have a substantially uniform thickness. For example, as illustrated in FIG. 4B, the distance or thickness (e.g., $t_G$) of the HTL 404*d* between the second electrode layer 404*e* and the emissive layer 404*c* for the green color sub-pixel stack 400B is configured such that a phase shift associated with an emission from the emissive layer 404*c* to the second electrode layer 404*e* and back to the emissive layer 404*c* is $2\pi$ (i.e., a $2\pi$ round-trip phase shift). It should be noted that the three sub-pixels in FIGS. 4A, 4B, and 4C have different phase shifts for the round trip to the emission layer because the wavelengths are different. Therefore, only one of the three sub-pixels may meet the optimum requirement.

In one example, the central wavelength of any of the red, green, or blue sub-pixel stack may be used to determine the thickness in the sub-pixel stacks. In other examples, the wavelength at the centre of the entire wavelength range may be used to determine the thickness in the red, green, and blue sub-pixel stacks. The angular distribution from the green color sub-pixel stack 400B may be approximately Lambertian (meeting the mode requirement with an optimum on-axis brightness) in the first and second filler materials (e.g., 410, 412). The majority of the on-axis light from the green color sub-pixel stack 400B may be the main emission peak (e.g., the main emission peak 414 in the example structure 400D of FIG. 4D, the example angular distribution diagram 400E of FIG. 4E, the example structure 400H of FIG. 4H, and the example angular distribution diagram 400I of FIG. 4I) that directly passes through the first and second filler materials (e.g., 410, 412) of the light emitting structure 400D. Light emitted in off-axis directions (e.g., such as off-axis emission 418 from the sub-pixel stack 404, as illustrated in FIGS. 4D, 4F, 4J, may be reflected by the interface 420) via TIR onto the bank 406, and be collimated (e.g., 416) as part of the main emission peak 414.

In one or more implementations, with reference to FIGS. 4F, 4G, 4J, and 4K, the different color emitting layers (e.g., in the red color sub-pixel stack 400F or the blue color sub-pixel stack 400J) other than the green color emitting layer (e.g., of the green color sub-pixel stack 400H) may be de-tuned, in that the HTL thickness (e.g., $t_R$ for red and $t_B$ for blue) may no longer imply a $2\pi$ round-trip phase shift, and form a main emission "double peak" 414 (e.g., the two peaks indicated by 414 as less prominent in FIG. 4G (the on-axis brightness will be reduced and side lobes will be more prominent, double peaking in FIG. 4G is not quite correct in general) and the two peaks indicated by 414 as more prominent in FIG. 4K). Such de-tuning of the different color emitting layers may reduce on-axis brightness but may increase the amount of off-axis emissions that may be reflected via TIR (e.g., 418 in FIGS. 4F, 4G, 4J, and 4K). Such off-axis emissions may propagate to the bank and recollimate (e.g., 416 in FIGS. 4F and 4J) to compensate for the loss in brightness from the on-axis emission 414, thus leading to a minimal change in the overall angular distribution. In one implementation, the central wavelength of the green light emissions is set as the optimal emission so that the HTL thickness constitutes a $2\pi$ round-trip phase shift, while the red and blue light emissions are different in angular profile from the green emissions. In one or more preferred implementations, the central wavelength of the red light emissions is set as the optimal emissions so that the round trip phase shift is $2\pi$. In order to achieve minimal changes in the overall angular distribution, the amount of off-axis light emissions that is reflected via TIR by the interface increases or reduces proportionally to the amount of on-axis light emissions transmitted through the filler materials. The bank then re-collimates the off-axis light emissions that are reflected via TIR, which compensate for the loss of the amount of on-axis light emissions transmitted through the filler materials. Thus, in one or more implementations where all HTLs of different colored sub-pixel stacks have substantially the same thickness, there is an increased tolerance to angular distribution with respect to the different wavelengths as compared to the implementations where all HTLs of different colored sub-pixel stacks have different HTL thicknesses. As such, it is possible to achieve a low color shift light emitting structure with equal HTL thicknesses. The may require differing pixel sizes for the three sub-pixel stacks in order to tune the ratio of TIR light (that depending inversely on pixel size) to on-axis light (that does not depend on pixel size). In one or more implementations, the HTL thicknesses are equal, however, the equal thicknesses or uniform distance among the different colored sub-pixel stacks are not limited to only the example HTL thicknesses but may also be applicable to any of the layers (e.g., TFB layer or PEDOT:PSS layer) within the HTL.

In comparison to the implementations where the HTL thickness is normally one wavelength such as to give a $4\pi$ or higher multiple phase shift, implementations of the present application, where all HTLs of different-colored sub-pixel stacks have substantially the same thickness, may result in broader angular distribution that may significantly excite high loss modes in the filler layers (specifically emissions close to the TIR angle). However, fabricating HTLs with equal thicknesses may eliminate the multiple fabrication steps, which in turn simplifies and increases yield of fabrication hence reducing cost.

Figure 5:
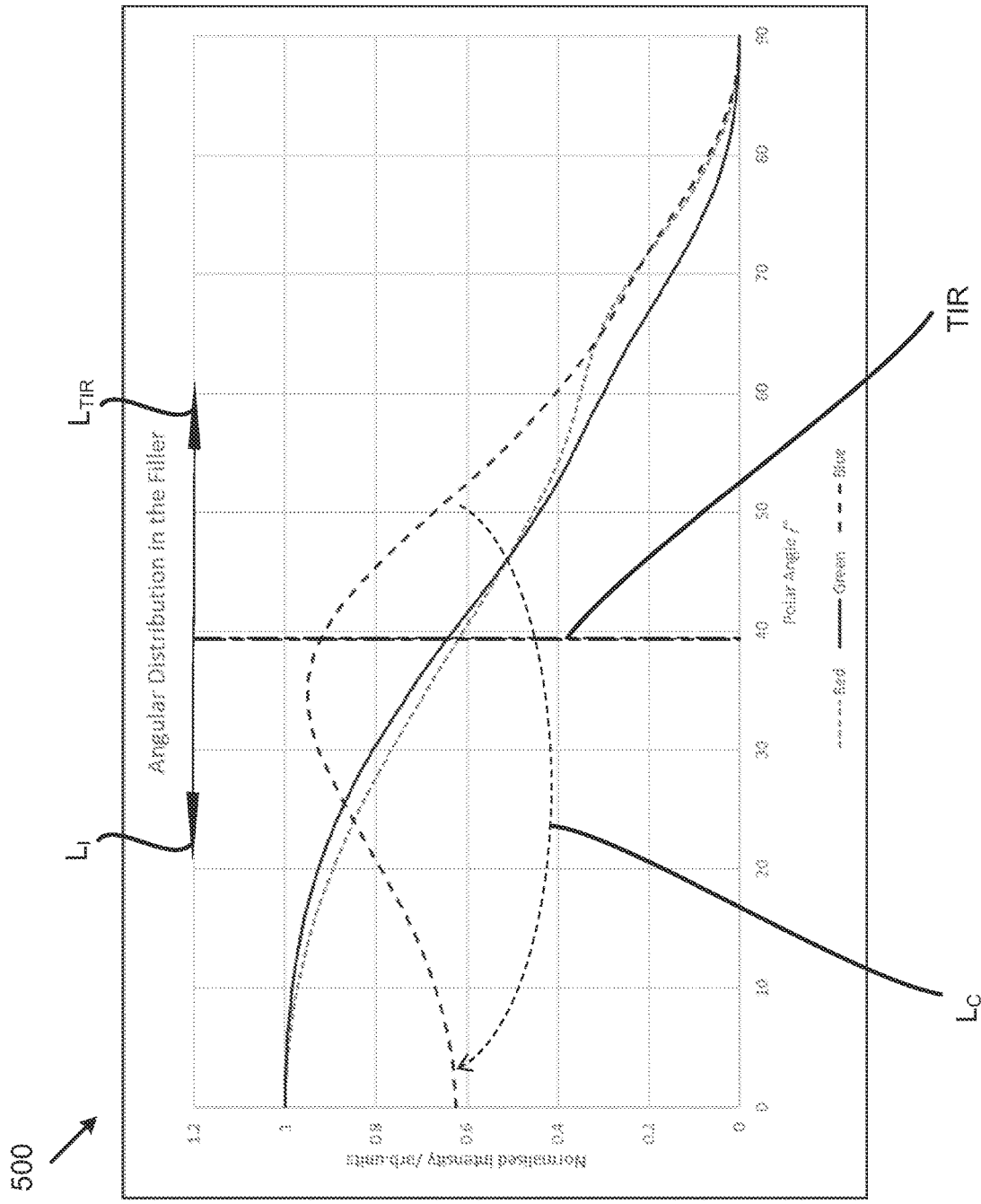
FIG. 5 is schematic diagram illustrating angular distributions of an example light emitting structure in accordance with an example implementation of the present disclosure.

FIG. 5 is schematic diagram illustrating angular distributions of an example light emitting structure in accordance with an example implementation of the present disclosure. The diagram 500 simulates angular distributions, measured in the filler materials, of a red emitting sub-pixel stack, a green emitting sub-pixel stack, and a blue emitting sub-pixel stack in an example light emitting structure that applies HTLs having substantially uniform distance (e.g., substantially equal HTL thicknesses). The example light emitting structure in the present implementation may be similar to the example light emitting structures 400D in FIG. 4D, 400F in FIG. 4F, 400H in FIG. 4H, and 400J in FIG. 4J.

In the present implementation, the example light emitting structure may include a substrate, the red emitting sub-pixel stack, the green emitting sub-pixel stack, and the blue emitting sub-pixel stack on the substrate, a first filler material on the sub-pixel stacks, a second filler material on the first filler material, an interface between the first and second filler materials, a glass substrate on the second filler material, and a banks surrounding the sub-pixel stacks. Each of the three sub-pixel stacks may include a second electrode made of silver back reflector and a 10 nm thick ITO layer on the silver reflector, an HTL including a 40 nm thick PEDOT:PSS layer on the ITC) layer and a 20 nm thick TFB layer on the PEDOT:PSS layer, an emissive layer on the HTL, an ETL on the emissive layer, and a transparent first electrode on the ETL. In the present implementation, a transparent ITO cathode may be used. In the present implementation, the red color emissive layer may emit red color emissions, thicknesses and materials of the red emissive layer (assumed to be thin) and the ETL may be a 20 nm Indium Phosphide (InP) QD red emissive layer and a 20 nm Magnesium Zinc Oxide (MgZnO) ETL. In the present implementation, with reference to the diagram 500 of FIG. 5, the phase shift associated with light emissions from the emissive layer to the bottom reflector and back to the emissive layer in the red emitting sub-pixel stack (high density dotted line in FIG. 5) is substantially $2\pi$ while the phase difference for the green sub-pixel stack (solid line in FIG. 5) has a small shift with respect to the red emitting sub-pixel stack, and the blue sub-pixel stack (lower density dotted line in FIG. 5) are significantly different from the red emitting sub-pixel stack, however, the angular distributions of the blue sub-pixel stack on either side of a total internal reflection line TIR in the diagram 500 of FIG. 5 are similar. With such similar angular distributions, light re-collimated by the bank may compensate $L_C$ for the differences in the angular distributions of the green sub-pixel stack and the blue sub-pixel stack relative to the red color sub-pixel stack. On the left side of the TIR line, light emissions $L_I$ are transmitted through the filler materials. On the right side of the TIR line, light emissions $L_{TIR}$ are reflected by the bank (via TIR angles on the filler materials). Light emissions close to the TIR angle may have high loss in light brightness through many bounces in the filler materials, thus the difference in angular distribution is further reduced. In the present implementation, the different color-emitting sub-pixel stacks of the example light emitting structure have substantially uniform thicknesses, the TFB layer may be 20 nm thick and the phase shift may be $2\pi$ (N=1) while in another implementation where the different color sub-pixel stacks have non-uniform thicknesses, the TFB layer may be 150-190 nm thick and the phase shift may be $4\pi$ (N=2) for all sub-pixel stacks.

FIG. 6A is schematic diagram illustrating extraction efficiency of example light emitting structures having various distances in accordance with an example implementation of the present disclosure. FIG. 6B is schematic diagram illustrating peak brightnesses of the example light emitting structures having the various distance in FIG. 6A. The schematic diagram 600A in FIG. 6A simulates results of extraction efficiency of example light emitting structures having various distances (e.g., HTLs having different thicknesses, for example, 32 nm, 65 nm, 120 nm, 150 nm, and 190 nm) at different bank angles. The schematic diagram 600A simulates extraction efficiency from the entire sub-pixel stack into air with the assumption of a 2.5 μm thick filler material, an equal bank height, the low index layer (e.g., first filler material) having a refractive index of 1.2. These simulations also assume a finite spectral width for a red color of a known typical type of QD emission (red color emissions are closest to an optical mode of N=1 or a phase shift associated with an emission from the emissive layer to the first electrode and back to the emissive layer being 2π). The extraction efficiencies or angular distributions for various HTL thicknesses of 32 nm, 65 nm and 120 nm illustrate little variation as shown in FIG. 6A. The schematic diagram 600B in FIG. 6B simulates results of peak brightnesses of the example light emitting structures in FIG. 6A having various distances (e.g., HTLs having different thicknesses, for example, 32 nm, 65 nm, 120 nm, 150 nm, and 190 nm).

In one implementation where a light emitting structure may have a HTL thickness of 190 nm, the extraction efficiency (630A in FIG. 6A) and peak brightness (630B in FIG. 6B) are the highest among the HTL thicknesses in diagram 600A in FIG. 6A and diagram 600B in FIG. 6B.

In one or more implementations where a light emitting structure may have a HTL thickness of 32 nm, 65 nm, or 120 nm, the extraction efficiency (circle 640A in FIG. 6A) in diagram 600A of FIG. 6A and peak brightness (circle 640B in FIG. 6B) in diagram 600B of FIG. 6B may be lower relative to the extraction efficiency (630A) and peak brightness (630B) of a HTL thickness of 190 nm. In one or more implementations, although efficiency and peak brightness for the HTL thickness of 32 nm, 65 nm, or 120 nm may be lower as compared to that for the HTL with a thickness of 190 nm, tolerance to a given range of wavelengths (e.g., red, green, or blue color emissions) for a constant HTL thickness (e.g., a thickness in the range of 32 nm-120 nm) may be higher. Thus, one HTL thickness (e.g., within 32 nm-120 nm) or an uniform distance may be used for all three different color-emitting (e.g., red, green and blue) sub-pixel stacks to provide a preferred on-axis brightness and reduced color shift while reducing cost with equal HTL thicknesses for all color sub-pixel stacks.

FIG. 7 is schematic diagram illustrating angular distributions of the example light emitting structure in FIG. 5 with respect to a Lambertian emission. Schematic diagram 700 in FIG. 7 illustrates angular distributions that are normalized with respect to a central brightness for red, green and blue color emitting sub-pixel stacks having uniform distance (e.g., substantially equal HTL thicknesses) of the example light emitting structure in FIG. 5 in comparison to a Lambertian light emission (e.g., dash-dot-dash line in FIG. 7). The angular distributions for the red, green, and blue color emitting sub-pixel stacks having uniform distance illustrate very similar results, thus allowing a low color shift while reducing cost for the sub-pixel stacks with different colors.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts.

As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A light emitting structure comprising:
a substrate;
a plurality of sub-pixel stacks emitting different colors over a surface of the substrate, each of the plurality of sub-pixel stacks including:
an emissive layer between a first transport layer and a second transport layer;
a first electrode layer coupled to the first transport layer; and
a second electrode layer coupled to the second transport layer;
a bank surrounding each of the plurality of sub-pixel stacks and forming an interior space above each of the plurality of sub-pixel stacks;
a first filler material in the interior space and having a first refractive index;
a second filler material over the first filler material and having a second refractive index lower than the first refractive index; and
an interface between the first filler material and the second filler material,
wherein:
the plurality of sub-pixel stacks has a substantially uniform distance between the emissive layer and the first electrode layer;
at least one of the plurality of sub-pixel stacks emits a main emission peak into the filler materials along an on-axis direction substantially normal to a top surface of the at least one of the plurality of sub-pixel stacks; and
the at least one of the plurality of sub-pixel stacks is configured to an optical mode (N=1) such that a phase shift associated with an emission from the emissive layer of the at least one one of the plurality of sub-pixel stacks to the first electrode of the at least one one of the plurality of sub-pixel stacks and back to the emissive layer of the at least one of the plurality of sub-pixel stacks is 2π.

2. The light emitting structure of claim 1, wherein at least one of the plurality of sub-pixel stacks is configured to emit light in a plurality of wavelengths having a central wavelength.

3. The light emitting structure of claim 1, wherein emissions in off-axis directions away from the on-axis direction are reflected off the interface via total internal reflection at least once before being reflected off a sloped-surface of the bank and emitted in the on-axis direction through the first filler material.

4. The light emitting structure of claim 1, wherein, in at least one of the plurality of sub-pixel stacks, a phase shift associated with an emission from the emissive layer to the first electrode layer and back to the emissive layer is either less than 2π or greater than 2π, resulting in a change in brightness in the main emission peak.

5. The light emitting structure of claim 4, wherein emissions in off-axis directions away from the on-axis direction of the at least one of the plurality of sub-pixel stacks are reflected off the interface via total internal reflection at least once before being reflected off a sloped-surface of the bank and emitted in the on-axis direction through the first filler material.

6. The light emitting structure of claim 5, wherein the emissions in off-axis directions reflected off the sloped-surface are collimated with the main emission peak, thereby compensating the change in brightness in the main emission peak.

7. The light emitting structure of claim 1, wherein the second filler material covers an entire top surface of the first filler material.

8. The light emitting structure of claim 1, wherein the second filler material covers a portion of a top surface of the first filler material.

9. The light emitting structure of claim 1, wherein sub-pixels associated with the plurality of sub-pixel stacks vary in size to optimize color shift.

10. The light emitting structure of claim 1, wherein:
the emissive layer includes quantum dot emission material;
the first transport layer includes a hole transport layer;
the second transport layer includes an electron transport layer;
the first electrode layer is an anode layer including a metallic reflector for reflecting the light emitted from the emissive layer; and
the second electrode layer is a cathode layer including a non-metallic and substantially transparent material.

11. The light emitting structure of claim 1, wherein the main emission peak emitted through the interface from the at least one of the plurality of sub-pixel stacks has a minimum of light reflected by total internal reflection over all pixels.

12. The light emitting structure of claim 1, wherein the main emission peak is emitted through the interface along the on-axis direction in a central region of at least one of the sub-pixel stacks of the light emitting structure.

13. The light emitting structure of claim 1, wherein:
the emissive layer includes quantum dot emission material;
the first transport layer includes an electron transport layer;
the second transport layer includes a hole transport layer;
the first electrode layer is a cathode layer having a metallic reflector for reflecting the light emitted from the emissive layer; and
the second electrode layer is an anode layer having a non-metallic and substantially transparent material.

14. A display device comprising the light emitting structure of claim 1.

15. A sub-pixel structure comprising:
a plurality of sub-pixel stacks emitting different colors, each of the plurality of sub-pixel stacks including an emissive layer between a first transport layer and a second transport layer, a first electrode layer coupled to the first transport layer, and a second electrode layer coupled to the second transport layer;
a bank surrounding each of the plurality of sub-pixel stacks and forming an interior space above each of the plurality of sub-pixel stacks;
a first filler material in the interior space and having a first refractive index;
a second filler material over the first filler material and having a second refractive index lower than the first refractive index; and
an interface between the first filler material and the second filler material,
wherein:
the plurality of sub-pixel stacks has a substantially uniform distance between the emissive layer and the first electrode layer;
at least one of the plurality of sub-pixel stacks is configured to emit light in a plurality of wavelengths having a central wavelength;
the distance between the emissive layer and the first electrode layer is predefined so that at least one of the plurality of sub-pixel stacks emits a main emission peak into the filler materials along an on-axis direction substantially normal to a top surface of the at least one of the plurality of sub-pixel stacks;
the main emission peak emitted through the interface from the at least one of the plurality of sub-pixel stacks has a minimum of light reflected by total internal reflection over all pixels; and
in the at least one of the plurality of sub-pixel stacks, a phase shift associated with an emission from the emissive layer to the first electrode and back to the emissive layer is $2\pi$.

16. A sub-pixel structure comprising:
a plurality of sub-pixel stacks emitting different colors, each of the plurality of sub-pixel stacks including an emissive layer between a first transport layer and a second transport layer, a first electrode layer coupled to the first transport layer, and a second electrode layer coupled to the second transport layer;
a bank surrounding each of the plurality of sub-pixel stacks and forming an interior space above each of the plurality of sub-pixel stacks;
a first filler material in the interior space and having a first refractive index;
a second filler material over the first filler material and having a second refractive index lower than the first refractive index; and
an interface between the first filler material and the second filler material,
wherein:
the plurality of sub-pixel stacks has a substantially uniform distance between the emissive layer and the first electrode layer;
at least one of the plurality of sub-pixel stacks is configured to emit light in a plurality of wavelengths having a central wavelength;
the distance between the emissive layer and the first electrode layer is predefined so that at least one of the plurality of sub-pixel stacks emits a main emission peak into the filler materials along an on-axis direction substantially normal to a top surface of the at least one of the plurality of sub-pixel stacks;
the main emission peak emitted through the interface from the at least one of the plurality of sub-pixel stacks has a minimum of light reflected by total internal reflection over all pixels; and
in at least another of the plurality of sub-pixel stacks, a phase shift associated with an emission from the emissive layer to the first electrode and back to the emissive layer is either less than $2\pi$ or greater than $2\pi$, resulting in a change in brightness in a main emission peak.

17. The sub-pixel structure of claim 16, wherein emissions in off-axis directions away from the on-axis direction of the at least another of the plurality of sub-pixel stacks are reflected off the interface via total internal reflection at least once before being reflected off a sloped-surface of the bank and emitted in the on-axis direction through the first filler material.

18. The sub-pixel structure of claim 17, wherein the emissions in the off-axis directions reflected off the sloped-surface are collimated with the main emission peak, thereby compensating the change in brightness in the main emission peak.

* * * * *